United States Patent
Ochoa et al.

(10) Patent No.: US 6,812,762 B2
(45) Date of Patent: Nov. 2, 2004

(54) FAST MONO-CYCLE GENERATING CIRCUIT USING FULL RAIL SWING LOGIC CIRCUITS

(75) Inventors: Agustin Ochoa, Vista, CA (US); Phuong T. Huynh, Annandale, VA (US); John McCorkle, Vienna, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/235,845

(22) Filed: Sep. 6, 2002

(65) Prior Publication Data

US 2003/0080799 A1 May 1, 2003

Related U.S. Application Data

(60) Provisional application No. 60/317,496, filed on Sep. 7, 2001.

(51) Int. Cl.[7] ............................................. H03K 3/033
(52) U.S. Cl. ........................................ 327/229; 327/401
(58) Field of Search ........................... 327/227, 229, 327/112, 387, 391, 401, 403, 291, 295, 298

(56) References Cited

U.S. PATENT DOCUMENTS

| | | | | |
|---|---|---|---|---|
| 4,185,323 A | * | 1/1980 | Johnson et al. | 365/222 |
| 4,266,214 A | * | 5/1981 | Peters, Jr. | 340/323 R |
| 4,497,056 A | * | 1/1985 | Sugamori | 714/736 |
| 5,311,150 A | | 5/1994 | Engbretson et al. | 331/59 |
| 5,677,927 A | | 10/1997 | Fullerton | 375/130 |
| 5,948,115 A | * | 9/1999 | Dinteman | 714/738 |
| 6,058,057 A | * | 5/2000 | Ochiai et al. | 365/201 |
| 6,320,433 B1 | * | 11/2001 | Hinterscher | 327/112 |
| 6,351,246 B1 | | 2/2002 | McCorkle et al. | 343/795 |
| 6,505,032 B1 | | 1/2003 | McCorkle et al. | 455/41.2 |
| 6,700,939 B1 | | 3/2004 | McCorkle et al. | 375/295 |

FOREIGN PATENT DOCUMENTS

| | | |
|---|---|---|
| EP | 1 083 669 A1 | 3/2001 |
| WO | WO 00/54420 | 9/2000 |
| WO | WO 01/93441 A1 | 12/2001 |
| WO | WO 02/0311998 A3 | 4/2002 |

OTHER PUBLICATIONS

U.S. patent application Ser. No. 09/685,200, McCorkle, filed Oct. 10, 2000, XtremeSpectrum, Inc.

U.S. patent application Ser. No. 10/235,844, Huynh et al., filed Sep. 6, 2002, XtremeSpectrum, Inc.

U.S. patent application Ser. No. 09/684,400, filed Oct. 10, 2000, XtremeSpectrum, Inc.

U.S. patent application Ser. No. 09/685,198, filed Oct. 10, 2000, XtremeSpectrum, Inc.

U.S. patent application Ser. No. 09/685,205, filed Oct. 10, 2000, XtremeSpectrum, Inc.

PCT International Search Report mailed Dec. 9, 2002 in corresponding PCT application PCT/US02/28221.

(List continued on next page.)

*Primary Examiner*—Timothy P. Callahan
*Assistant Examiner*—Cassandra Cox
(74) *Attorney, Agent, or Firm*—Posz & Bethards, PLC

(57) ABSTRACT

A mono-cycle generating circuit comprises a control circuit, a multiplexer, and a driver switch circuit. The control circuit generates sets of timing pulses. The multiplexer selects one of the sets of timing pulses. The driver switch circuit outputs a mono-cycle based upon the selected set of timing pulses. The driver switch circuit comprises complementary sets of switches, each complementary set of switches including complementary amplitude pull-up/pull-down functions such that the output mono-cycle is a full rail swing mono-cycle.

20 Claims, 12 Drawing Sheets

OTHER PUBLICATIONS

PCT International Preliminary Examination Report, mailed Aug. 20, 2003 in corresponding PCT application, PCT/US02/28221.
Patent Abstracts of Japan —filed in the European Patent Office—Publication No. 02116214, Apr. 27, 1990.
Patent Abstracts of Japan —filed in the European Patent Office—Publication No. 60009215, Jan. 18, 1985.
M.Z. Win et al., "Ultra–Wide Bandwidth Time–Hopping Spread–Spectrum Impulse Radio for Wireless Multiple–Access Communications", IEEE Transactions on Communications, vol. 48, No. 4, Apr. 2000, pp. 679–691.
M. Luise et al., "Clock Synchronization for Wavelet–Based Multirate Transmissions", IEEE Transactions on Communications, vol. 48, No. 6, Jun. 2000, pp. 1047–1054.

* cited by examiner

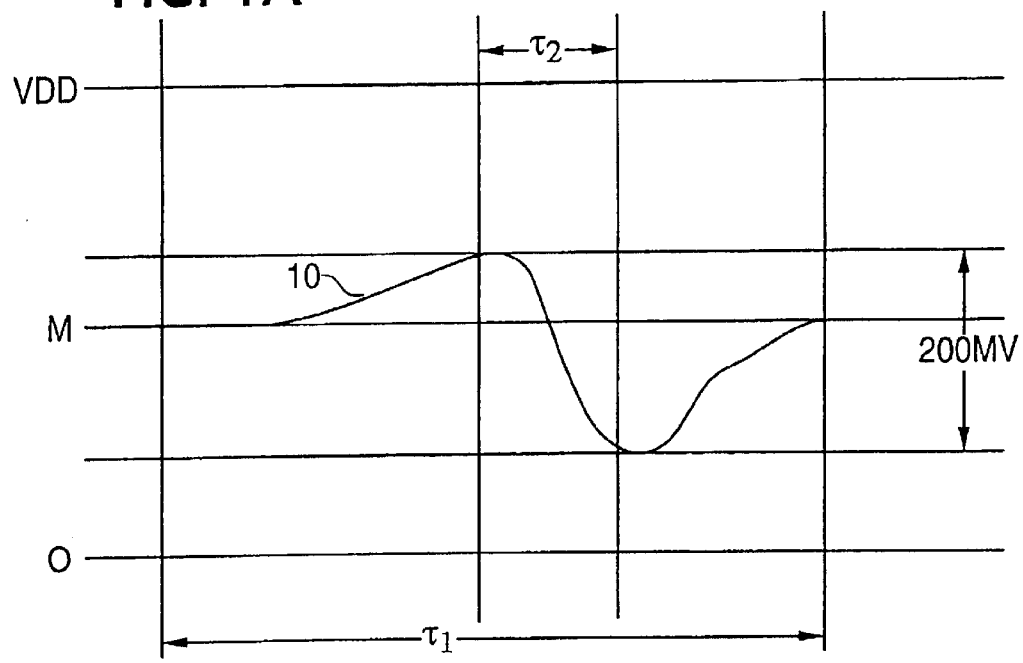
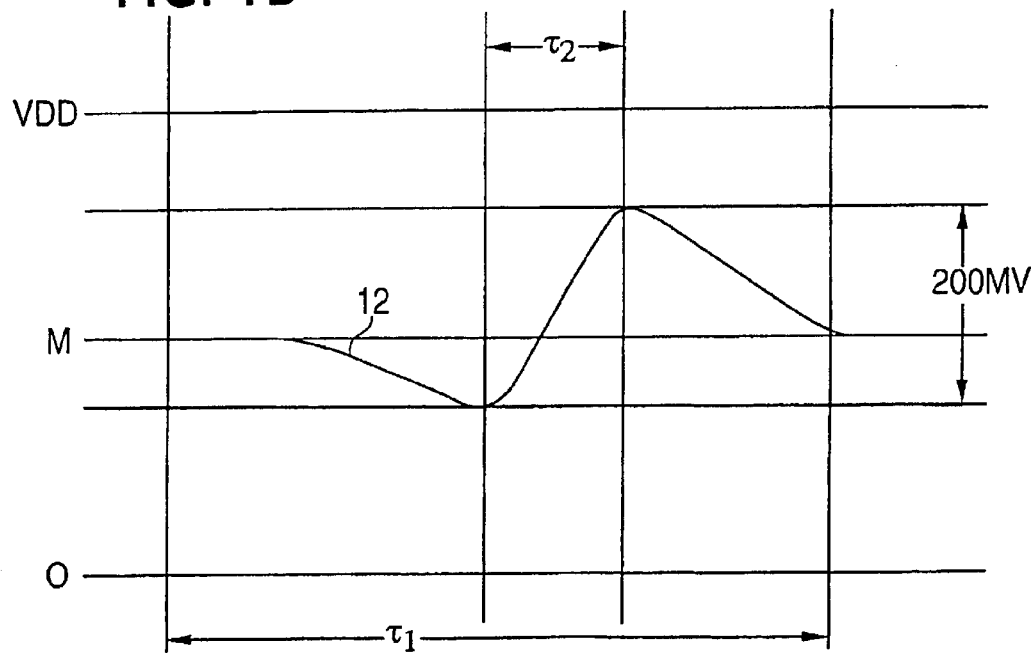

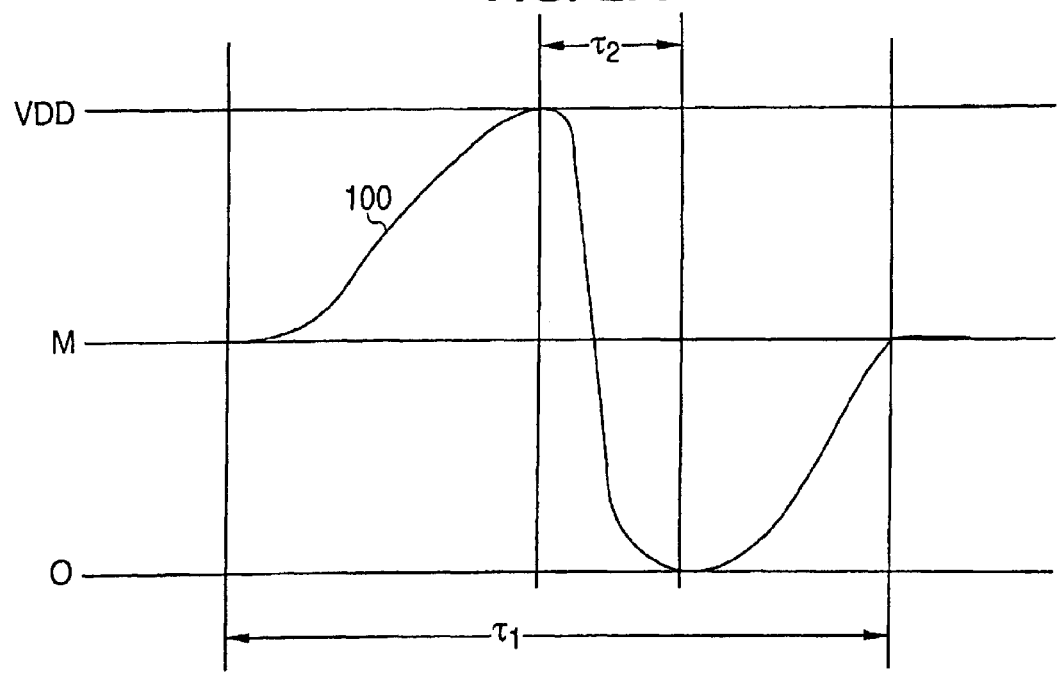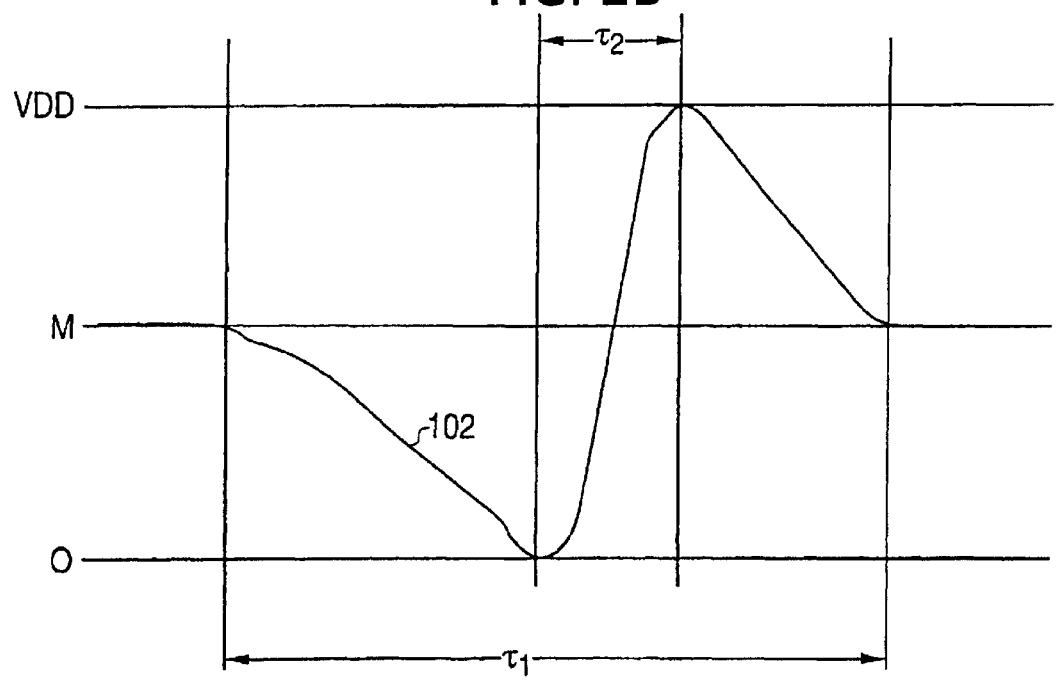

FIG. 7

| STATE (POSITIVE MONOCYCLE / NEGATIVE MONOCYCLE) | I | II | III | IV |
|---|---|---|---|---|
| SW1 | OPEN / OPEN | CLOSED / OPEN | OPEN / CLOSED | OPEN / OPEN |
| SW2 | OPEN / OPEN | OPEN / CLOSED | CLOSED / OPEN | OPEN / OPEN |
| SW3 | CLOSED / CLOSED | OPEN / CLOSED | CLOSED / OPEN | CLOSED / CLOSED |
| SW4 | CLOSED / CLOSED | CLOSED / OPEN | OPEN / CLOSED | CLOSED / CLOSED |

REGION

SWITCH

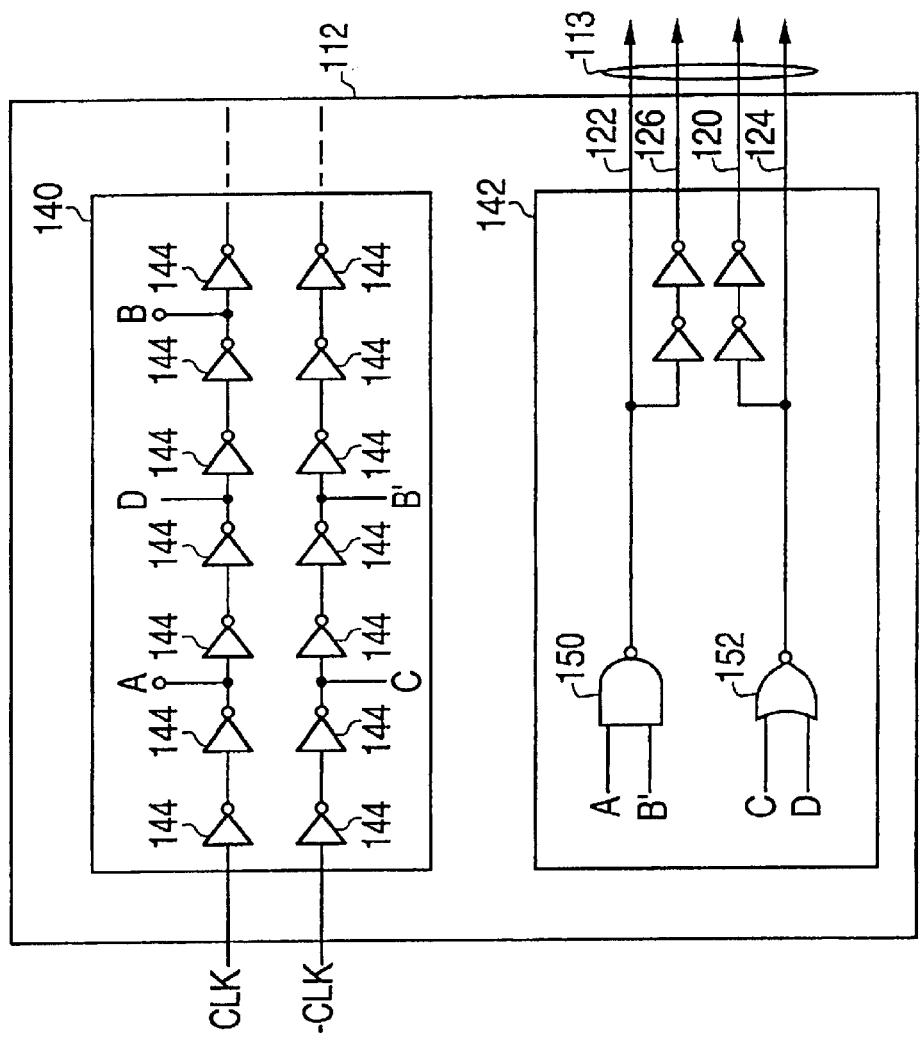

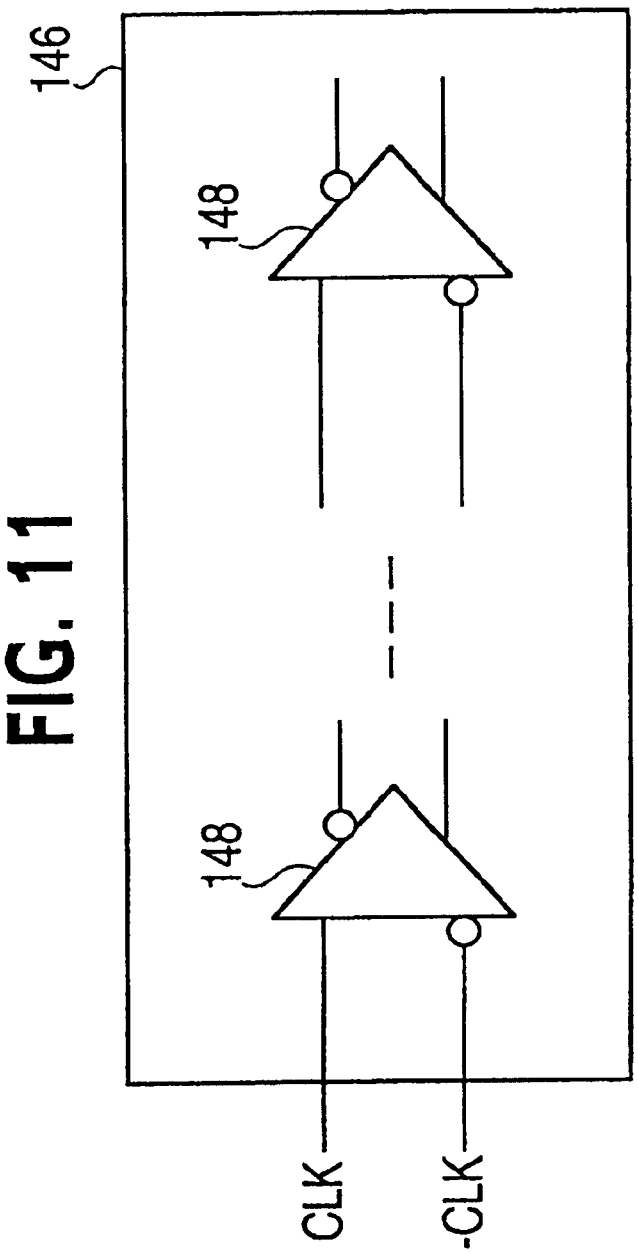

FAST MONO-CYCLE GENERATING CIRCUIT USING FULL RAIL SWING LOGIC CIRCUITS

CROSS-REFERENCE TO RELATED APPLICATIONS

This application is related to U.S. Provisional Application Ser. No. U.S. Ser. No. 60/317,496, filed Sep. 7, 2001, by Agustin Ochoa, Phuong Huynh, and John McCorkle, entitled *A FAST MONO-CYCLE GENERATING CIRCUIT USING FULL RAIL SWING LOGIC CIRCUITS*, to which the benefit of priority is claimed, and the contents of which is incorporated herein by reference.

BACKGROUND OF THE INVENTION

1. Field of the Invention

The present invention relates to ultra wide bandwidth spread-spectrum communications systems, and, more particularly, to generating mono-cycles using full rail swing logic circuits.

2. Description of the Related Art

Transmission of encoded data using wavelets is known in the art. However, a problem with circuit known in the art which generate such wavelets is power consumption. That is, such circuits dissipate large amounts of power and current, including standby current.

SUMMARY OF THE INVENTION

An aspect of the present invention is to transmit mono-cycles having a quiet value close to the middle of the voltage range between VDD and 0 volts, that is, close to mid-rail.

Another aspect of the present invention is to interject a negative mono-cycle followed by a positive mono-cycle, or vice versa.

Yet another aspect of the present invention is to encode information in sequences of mono-cycles.

A further aspect of the present invention is to shorten the peak-to-peak period of each mono-cycle to 100 picoseconds, which is determined based upon gate propagation times, a design parameter defined by the technology and design technique used.

Moreover, an aspect of the present invention is to provide a full rail swing, symmetric monocycle.

To achieve the above-mentioned aspects, a mono-cycle generating circuit of the present invention comprises a control circuit, a multiplexer, and a driver switch circuit. The control circuit generates sets of timing pulses. The multiplexer selects one of the sets of timing pulses. The driver switch circuit outputs a mono-cycle based upon the selected set of timing pulses. The driver switch circuit comprises complementary sets of switches, each complementary set of switches including complementary amplitude pull-up/pull-down functions such that the output mono-cycle is a full rail swing mono-cycle.

Moreover, the present invention is an apparatus comprising a control circuit, a multiplexer, and a driver switch circuit. The control circuit receives an input clock signal and an input inverse clock signal, and outputting based upon the input clock signal and the input inverse clock signal, a first set of timing signals and a second set of timing signals. The multiplexer receives the first set of timing signals and the second set of timing signals, and receiving an input logical value. The multiplexer selects and outputs as selected timing signals one of the first set of timing signals and the second set of timing signals based upon the input logical value. The driver switch circuit receives the selected timing signals. The driver switch circuit comprises a first p-MOS transistor coupled to a first n-MOS transistor, and a second p-MOS transistor coupled to a second n-MOS transistor through a voltage divider. The selected timing signals comprise a first subset of timing signals and a second subset of timing signals, the first subset coupled to and controlling the respective gates of the first and second n-MOS transistors, and the second subset coupled to and controlling the respective gates of the first and second p-MOS transistors such that each of the p-MOS and the n-MOS transistors makes a state transition simultaneously to output a mono-cycle.

In addition, the present invention is an apparatus comprising means for receiving an input clock signal and an input inverse clock signal, and outputting based upon the input clock signal and the input inverse clock signal, a first set of timing signals and a second set of timing signals, and for outputting a set of timing signals, and a driver switch circuit receiving the timing signals. The driver switch circuit comprises a first p-MOS transistor coupled to a first n-MOS transistor, and a second p-MOS transistor coupled to a second n-MOS transistor through a voltage divider. The selected timing signals comprise a first subset of timing signals and a second subset of timing signals. The first subset is coupled to and controls the respective gates of the first and second n-MOS transistors, and the second subset is coupled to and controls the respective gates of the first and second p-MOS transistors such that each of the p-MOS and the n-MOS transistors makes a state transition simultaneously to output a mono-cycle.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 1A and 1B show examples of mono-cycles.

FIGS. 2A and 2B show examples of mono-cycles generated by a mono-cycle generating circuit of the present invention.

FIG. 7 is a table showing the respective states of switches SW1, SW2, SW3, and SW4 in regions I, II, III, and IV of the positive mono-cycle 100 and the negative mono-cycle 102.

FIG. 10 is a circuit diagram of control circuit 112 of the present invention shown in FIG. 4.

FIG. 11 shows an example of differential in/differential out logic 146, using differential inverters 148.

DETAILED DESCRIPTION OF THE PREFERRED EMBODIMENTS

Before a detailed description of the present invention is presented, a brief description of mono-cycles is presented. FIGS. 1A and 1B show examples of mono-cycles. Whether a mono-cycle is a positive mono-cycle or a negative mono-cycle is arbitrarily selected. Sequences of the mono-cycles 10, 12 shown in FIGS. 1A and 1B, either individually or in series, encoded as logical "1" or logical "0" transmit information from an ultra-wide bandwidth transmitter to an ultra-wide bandwidth receiver.

The present invention comprises a mono-cycle generating circuit implemented on a silicon chip or in discrete components and using either Complementary Metal-Oxide-Silicon (CMOS) or complementary bi-polar transistors.

FIG. 2A shows a positive mono-cyclic signal (or positive mono-cycle) 100 and FIG. 2B shows a negative mono-cyclic signal (or negative mono-cycle) 102 generated by the mono-cycle generating circuit of the present invention.

An aspect of the present invention is the ability to generate mono-cycles of either polarity, positive or negative, and to generate a sequence of mono-cycles of a given number of mono-cycles at a system clock rate. This ability of encoding a sequence of a given number of mono-cycles with a specific polarity pattern enables the conveying of information. The voltage levels of the mono-cycles shown in FIGS. 2A and 2B range between VDD volts (V) (set at a technology-defined level, 1.8 volts for 0.18 $\mu$m (micrometer) CMOS is typical) and 0V. This range of voltage levels between which the mono-cycles range are referred to as the rail swing. A mono-cycle whose voltage leves range between Vdd and 0 volts is referred to as having a full rail swing. The mid-range of the rail swing for the mono-cycles shown in FIGS. 2A and 2B is shown as M.

Figure 3:
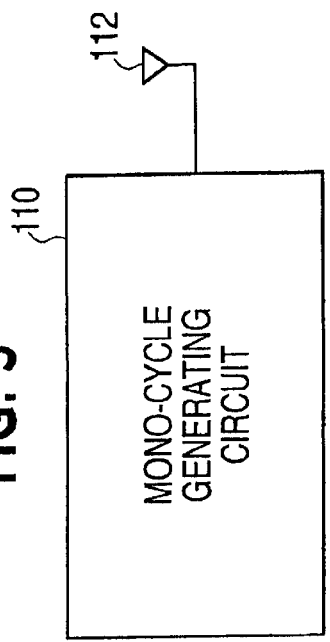
FIG. 3 shows a mono-cycle generating circuit 110 of the present invention, coupled to antenna 112.

FIG. 3 shows a mono-cycle generating circuit 110 of the present invention, coupled to antenna 112. The mono-cycle generating circuit 110 of the present invention comprises circuitry implemented using either complementary metal-oxide-silicon (CMOS) technology or complementary bipolar (n-p-n and p-n-p transistor) technology. The use of either CMOS or complementary bipolar technology in the mono-cycle generating circuit 110 of the present invention is advantageous over the use of ECL because both CMOS and complementary bipolar technology are able to produce symmetric, full rail swing (or rail-to-rail swing) mono-cycles, thus providing mono-cycles having more power to antenna 112, while reducing power consumption of the mono-cycle generating circuit 110. Moreover, CMOS technology is readily available and mature, relatively inexpensive to implement, and is an industry standard.

Figure 4:
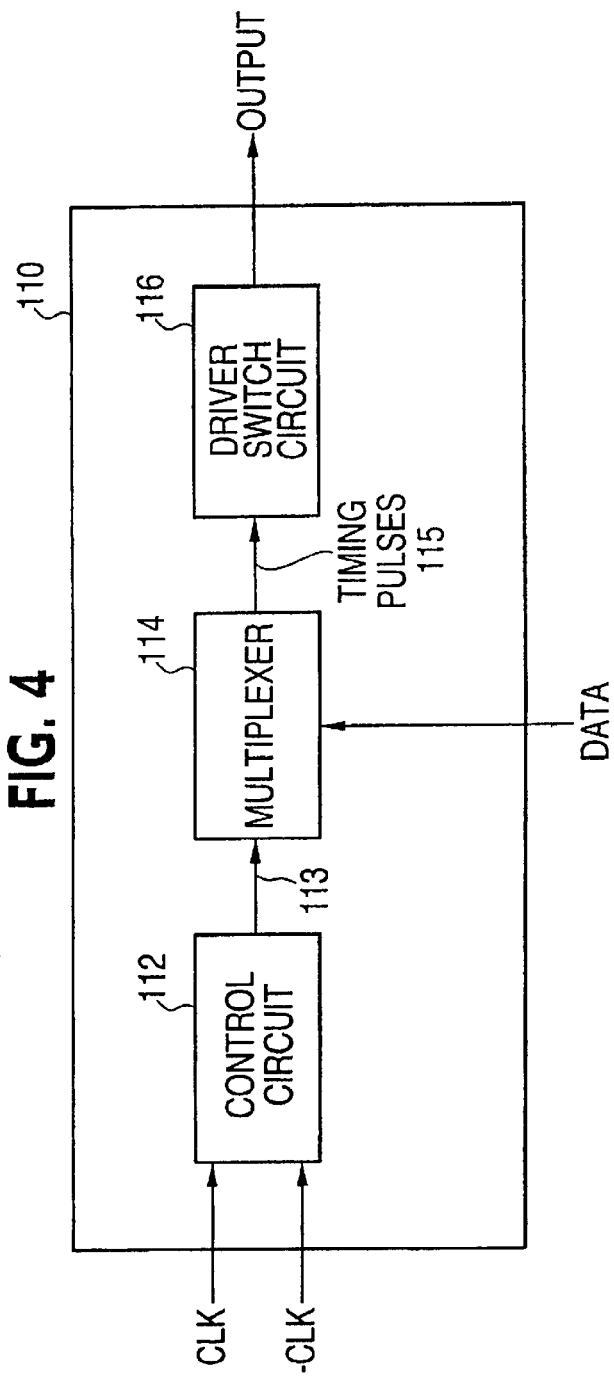
FIG. 4 shows a block diagram of the mono-cycle generating circuit 110 of the present invention.

FIG. 4 shows a block diagram of the mono-cycle generating circuit 110 of the present invention. To produce symmetric, full rail swing monocycles, the mono-cycle generating circuit 110 of the present invention includes a control circuit 112 coupled to a multiplexer 114, which is coupled to a driver switch circuit 116, as shown in FIG. 4. As is explained in detail herein below, control circuit 112 produces and transmits series of timing pulses 113, one series of which multiplexer 114 selects as timing pulses 115 based upon the logical value of DATA to transmit to driver switch circuit 116 to produce as OUTPUT either a positive mono-cycle 100 or a negative mono-cycle 102 shown in FIGS. 2A and 2B, respectively. Timing pulses 113, 115 are disclosed in detail beginning with reference to FIGS. 9A–9D.

Figure 5:
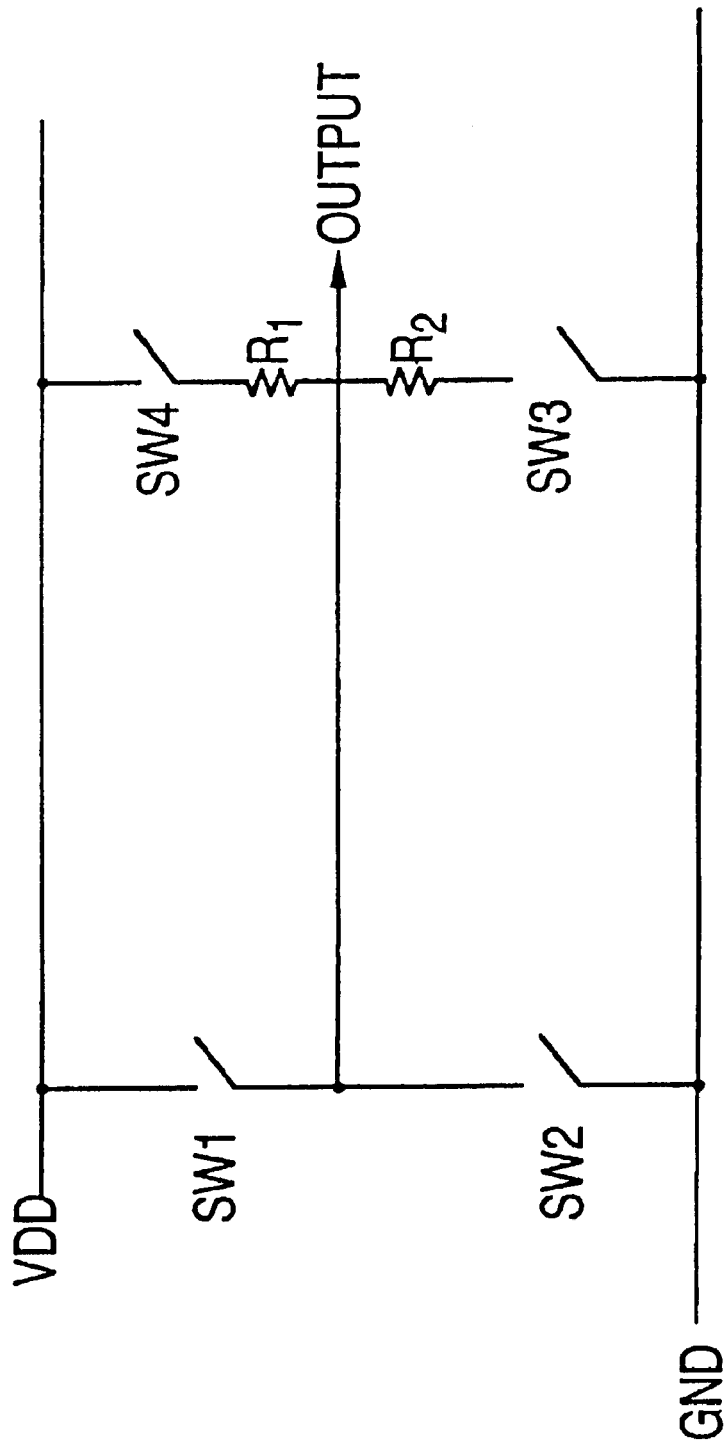
FIG. 5 shows a transistor implementation of driver switch circuit 116 of the present invention.

Driver switch circuit 116 is now explained in further detail. FIG. 5 shows a transistor implementation of driver switch circuit 116 of the present invention. The transistor implementation shown in FIG. 5 includes complementary sets of switches, each complementary set of switches including complementary amplitude pull-up/pull-down functions such that the output mono-cycle is a full rail swing mono-cycle. Depending upon how the transistor implementation of the driver switch circuit 116 is controlled by control circuit 112 and multiplexer 114, that is, based upon which switches SW1, SW2, SW3, or SW4 are open or closed and in what sequence, either positive mono-cycle 100 or negative mono-cycle 102 is produced as OUTPUT by the transistor implementation of driver switch circuit 116. As is explained in further detail herein below, the state of switches SW1 and SW4 control that portion of the mono-cycle 100, 102 going above mid-rail while the state of SW2 and SW3 control that portion of the mono-cycle 100, 102 going below mid-rail. A return of the mono-cycles 100, 102 to mid-rail (M) is based upon the voltage divider including resistors R1 and R2 connected in parallel with OUTPUT.

Figure 6A:
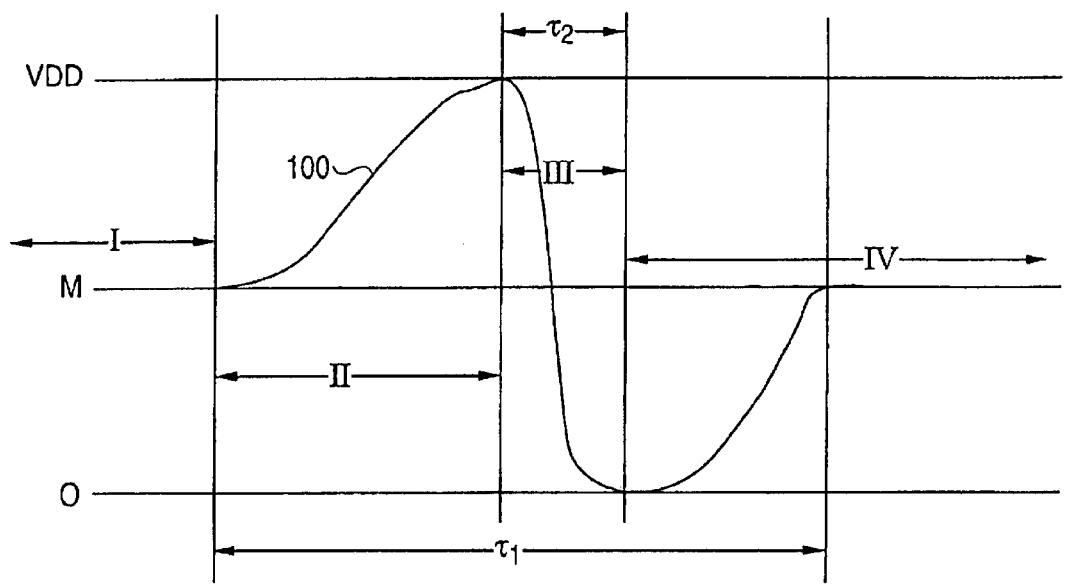
FIGS. 6A and 6B show positive mono-cycle 100 and negative mono-cycle 102 divided into regions I, II, III, and IV.
Figure 6B:
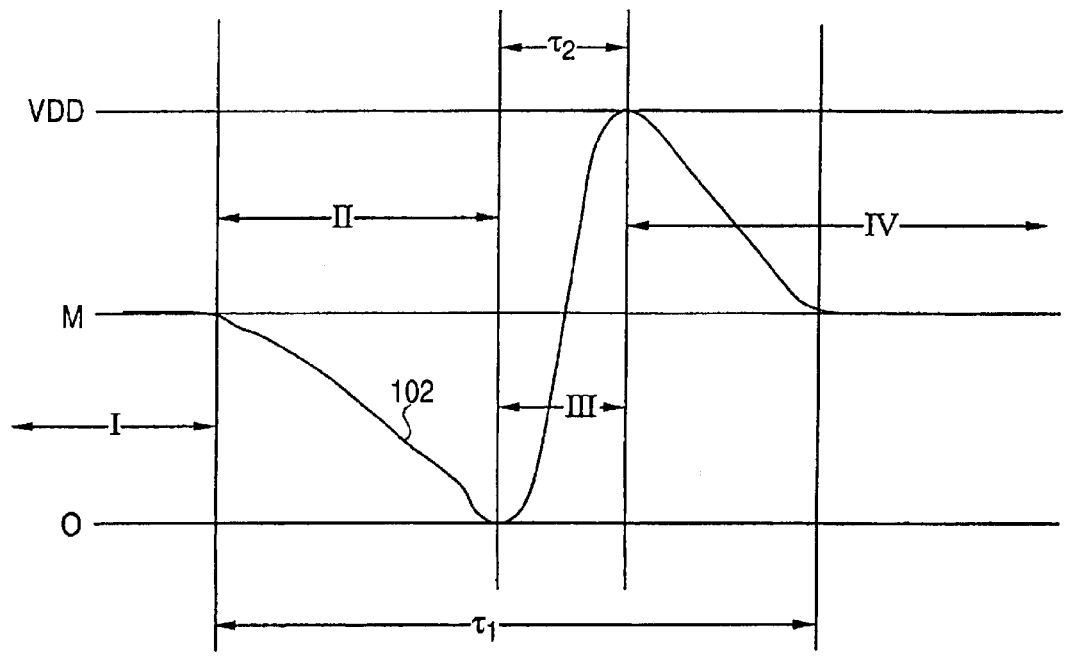

FIGS. 6A and 6B show positive mono-cycle 100 and negative mono-cycle 102, as shown in FIGS. 2A and 2B, respectively, but with the periods for each divided into regions I, II, III, and IV as indicated. For the following explanation, reference is made to the positive mono-cycle 100 shown in FIG. 6A. However, the transistor implementation shown in FIG. 5 also produces negative mono-cycle 102 as shown in FIGS. 2B and 6B, as explained herein below.

Referring now to FIG. 6A, region I occurs before the start of the first pulse of the mono-cycle 100. In period I, switches SW3 and SW4 are closed, and switches SW1 and SW2 are open. The value of OUTPUT is at the mid-rail M, based upon resistive divider R1, R2.

Referring again to FIG. 6A, to move the positive mono-cycle 100 into region II, switch SW1 is closed and, simultaneously, switch SW3 is opened. That is, in region II, switch SW1 is closed, switch SW2 is open, switch SW3 is open, and switch SW4 is closed. In region II, the value of positive mono-cycle 100 proceeds from mid-rail (M) to VDD.

To move the mono-cycle 100 to region III, switches SW1 and SW4 are opened simultaneously, and switches SW2 and SW3 are closed simultaneously. In region III, the value of positive mono-cycle 100 moves from VDD to GND (ground, or 0 volts).

Next, to move the mono-cycle 100 proceeds to region IV, switch SW2 is opened and switch SW4 is closed. That is, switches SW1 and SW2 are open and switches SW3 and SW4 are closed, thus enabling the resistive divider R1, R2 to pull the value of positive mono-cycle 100 to mid-rail (M).

To produce the negative mono-cycle 102 shown in FIG. 6B, the state of switches SW1, SW2, SW3, and SW4 is the same as that of the positive mono-cycle 100 shown in FIG. 6A in regions I and IV. However, to produce the negative mono-cycle 102, switch SW2 is closed simultaneously with switch SW4 being opened in region II. That is, in region II of the negative mono-cycle 102, switch SW1 is open, switch SW2 is closed, switch SW3 is closed, and switch SW4 is open. In region III of the negative mono-cycle 102, switches SW1 and SW4 are closed, while switches SW2 and SW3 are open.

FIG. 7 is a table showing the respective states of switches SW1, SW2, SW3, and SW4 in regions I, II, III, and IV of the positive mono-cycle 100 and the negative mono-cycle 102, as described herein above. For example, in region II, switch SW2 is open to produce the positive mono-cycle 100, while switch SW2 is closed to produce the negative mono-cycle 102.

The above-mentioned transistor implementation shown in FIG. 5 can be implemented using either complementary bipolar transistors or CMOS.

Figure 8:
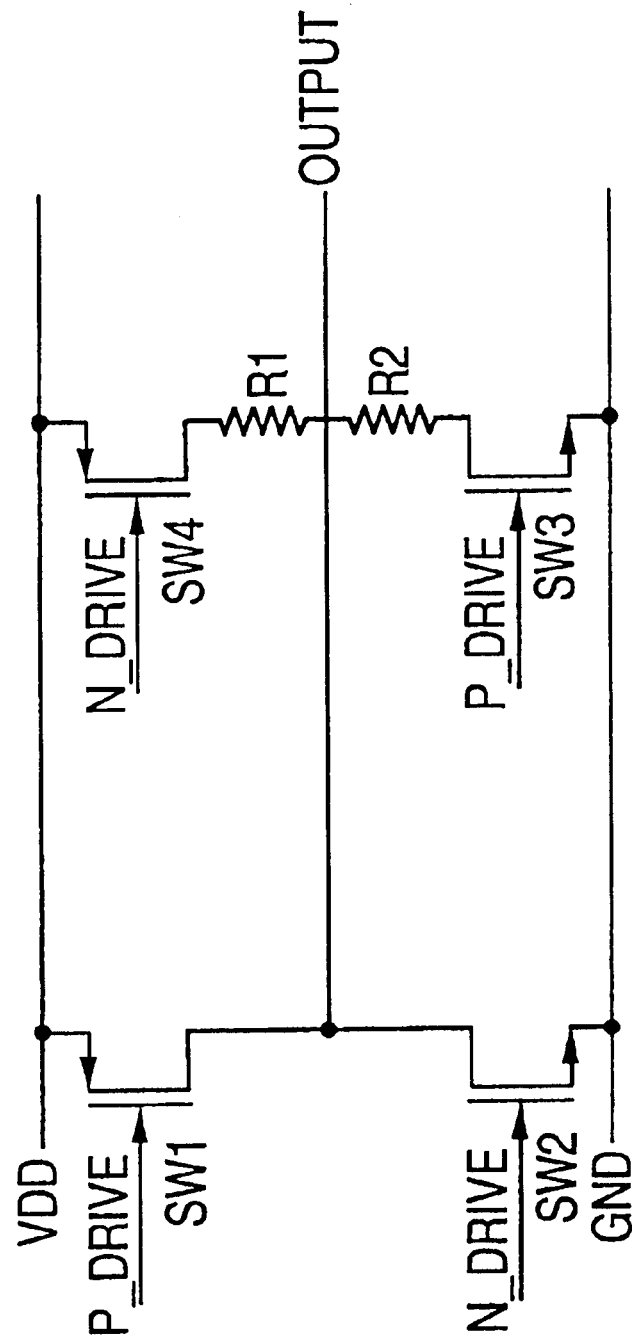
FIG. 8 shows an embodiment of a driver switch circuit 116 of the present invention, implemented in CMOS and corresponding to the transistor implementation shown in FIG. 5.

FIG. 8 shows an embodiment of a driver switch circuit 116 of the present invention, implemented in CMOS and corresponding to the transistor implementation shown in FIG. 5. That is, in FIG. 8, switches SW1, SW2, SW3, and SW4, and resistors R1 and R2, correspond, respectively, to switches SW1, SW2, SW3, and SW4, and resistors R1 and R2 shown in FIG. 5.

Referring now to FIG. 8, switches SW1 and SW4 each comprise a p-MOS transistor, whereas switches SW2 and SW3 each comprise an n-MOS transistor. OUTPUT is either the positive mono-cycle 100 or the negative mono-cycle 102, and is transmitted either off-chip to an antenna (112 in FIG. 3) which comprises a 50-ohm load, or to an internal load, such as a mixer, which is a high-impedance load to which OUTPUT is matched. Switches SW1, SW2, SW3, and SW4, and resistors R1 and R2, are sized to provide the required drive impedance to the load.

Although not shown in FIG. 8, the gates of the transistors corresponding to switches SW1, SW2, SW3, and SW4 are tied to timing pulses which close or open the switches in proper sequence. The timing pulses N_Drive and P_Drive, corresponding to timing pulses 115, are explained beginning with reference to FIGS. 9A through 9D. The timing pulses shown in FIGS. 9A through 9D, when presented to switches SW1 through SW4 in proper sequence, determine whether the driver switch circuit 116 of the present invention outputs as OUTPUT a positive mono-cycle 100 or a negative mono-cycle 102.

Figure 9A:
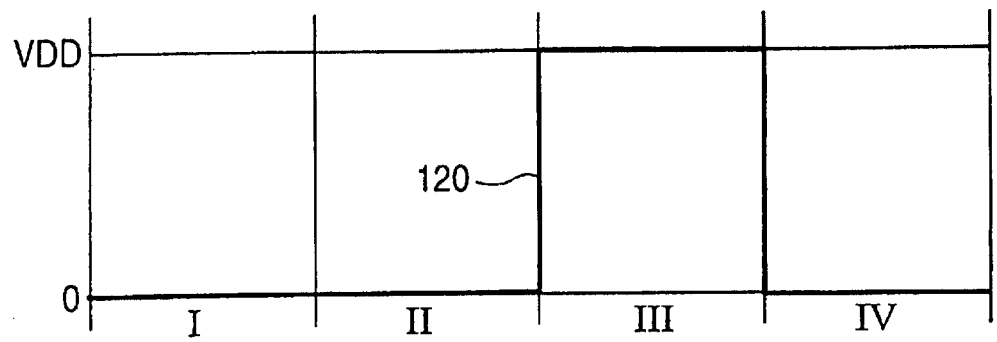
FIGS. 9A–9D show timing pulses generated by the mono-cycle generating circuit of the present invention.
Figure 9B:
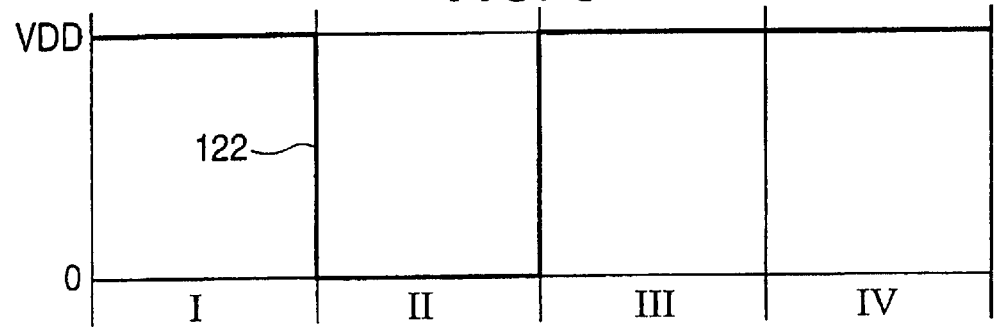
Figure 9C:
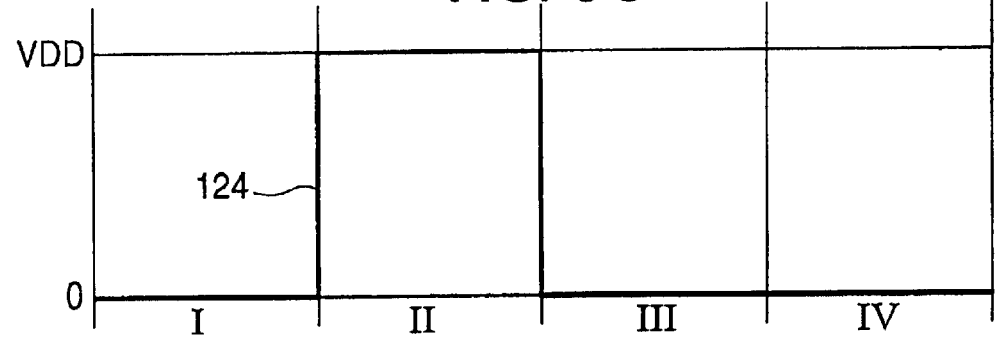
Figure 9D:
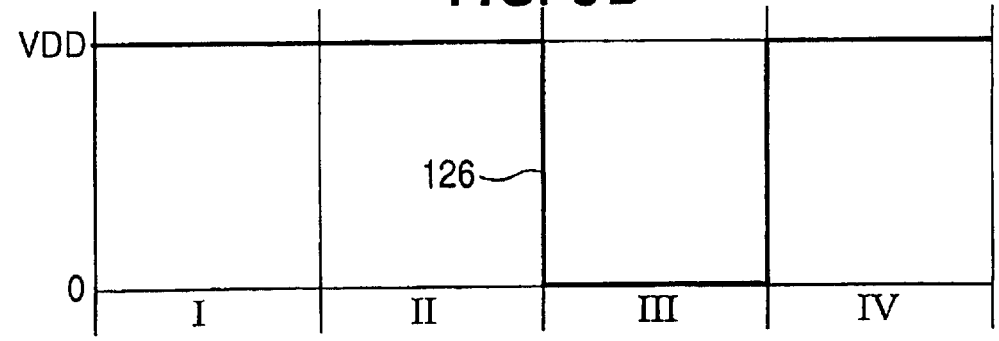

More particularly, FIGS. 9A through 9D show the voltage level (either VDD or 0) in each of regions I, II, III, and IV of mono-cycles 100, 102. If the timing signal 120 shown in FIG. 9A is presented simultaneously to the gates of the transistors shown in FIG. 8 corresponding to switches SW2 and SW4, and the timing signal 122 shown in FIG. 9B is presented simultaneously to the gates of the transistors shown in FIG. 8 corresponding to switches SW1 and SW3, then positive mono-cycle 100 is produced at OUTPUT. However, if the timing signal 124 shown in FIG. 9C is presented simultaneously to the gates of the transistors shown in FIG. 8 corresponding to switches SW2 and SW4, and the timing signal 126 shown in FIG. 9D is presented simultaneously to the gates of the transistors shown in FIG. 8 corresponding to switches SW1 and SW3, then negative mono-cycle 102 is produced at OUTPUT of the driver switch circuit 116.

More particularly, timing signal 120 is presented to switches SW2 and SW4 concurrently with timing signal 122 being presented to switches SW1 and SW3. Conversely, timing signal 124 is presented to switches SW2 and SW4 concurrently with timing signal 126 being presented to switches SW1 and SW3.

Since switches SW1 and SW4 comprise p-MOS transistors, a large negative voltage appearing at the gates of the p-MOS transistors with respect to the source of the p-MOS transistors closes switches SW1, SW4 and a low-impedance load is presented. Since switches SW2 and SW3 comprise n-MOS transistors, a large positive voltage appearing at the gates of the n-MOS transistors with respect to the source of the n-MOS transistors closes switches SW2, SW3 and a low-impedance load is presented.

Referring now to FIG. 9A, timing pulse 120 is low (that is, 0 volts) in regions I, II, and IV, and is high (that is, VDD) in region II. On the other hand, timing pulse 122 shown in FIG. 9B is high in regions I, II, and IV, but low in region II. That is, a downward, square pulse of timing signal 122 is presented to switches SW1 and SW3 in region II, then an upward, square pulse of timing signal 120 is presented to switches SW2 and SW4 in region III to produce positive mono-cycle 100 at OUTPUT of the driver switch circuit 116.

As shown in FIG. 9C, timing pulse 124 is low in regions I, II, and IV, but is high in region II. In contrast, timing pulse 126 shown in FIG. 9D is high in regions I, II, and IV, but is low in region III. That is, an upward, square pulse of timing signal 124 is presented to switches SW2 and SW4 in region II, then a downward, square pulse of timing signal 126 is presented to switches SW1 and SW3 in region III to produce negative mono-cycle 102 at OUTPUT of the driver switch circuit 116.

That is, if a downward, square pulse is asserted to the gates of SW1 and SW3 prior in time to an upward, square pulse being asserted to the gates of SW2 and SW4, then the output mono-cycle is a positive mono-cycle, whereas if a downward, square pulse is asserted to the gates of SW1 and SW3 subsequent in time to an upward, square pulse applied to the gates of SW2 and SW4, then the output mono-cycle is a negative mono-cycle. Moreover, the trailing edge of the downward, square pulse is aligned with the leading edge of the upward, square pulse if the downward, square pulse precedes the upward, square pulse in time, and the trailing edge of the downward, square pulse is aligned with the leading edge of the upward, square pulse, if the upward, square pulse precedes the downward, square pulse in time.

Timing pulses 120, 122, 124 and 126 are produced by control circuit 112 and presented to multiplexer 114 as timing pulses 113 shown in FIG. 4. A set of timing pulses, either timing pulses 120 and 122 or timing pulses 124 and 126, is then selected by multiplexer 114 and presented to driver switch circuit 116 as timing pulses 115 as shown in FIG. 4.

FIG. 10 is a circuit diagram of control circuit 112 shown in FIG. 4. As shown in FIG. 10, control circuit 112 includes a delay line 140 with tap points (or taps) A, B C, D, and B', and logic circuitry 142. The control circuit 112 receives as input clock signals CLK and −CLK (CLK inverted by 180 degrees), and outputs timing pulses 113. CLK is the clock signal, and −CLK is the inverted clock signal. One set of the timing pulses 113 is selected by multiplexer 114 as timing pulses 115 to drive driver switch circuit 116.

Referring now to FIG. 10, 2 series of delay strings, each comprising a series of inverters 144, are formed adjacent to each other to match more evenly in time signals output at tap points. Into one of the series of delay strings is input CLK, and into the other series of delay strings is input −CLK. Both series of delay strings provide n stages of delay (n being equal to the number of inverters 144 in the delay string) with respect to the drive clock CLK or −CLK. By selecting the taps A, B, and B' appropriately, the rise and fall phases of the timing signals 113 (shown in FIGS. 9A–9D) can be matched to each other. For example, as shown in FIG. 10, the logical value at tap point A is the same as the logical value of CLK delayed in time by the propagation delay of two inverters while the logical value at tap point B' is the same as the logical value of the negative of the logical value at tap A (that is, A_bar) delayed in time by the propagation delay of two inverter 144 stages. That is, since CLK and −CLK are defined as aligned with each other but complementary, when one rises the other falls during the same period, and this relation is maintained for corresponding pairs of taps along the inverter string, tap C is complementary to tap A. It is the same as A_bar. Tap B' being two inverters away from C shows the same logic as C only delayed (by two inverter 144 stages of propagation time. Tap B then is equal to Abar-delayed. Likewise, when tap points A and B are selected such that the logical value of A is equal to the logical value of B, then A and B are an even number (2n) of delays apart. The delay line 144 is referred to as single-in, single-out logic, which provides for ease in matching rise and fall times of the timing signals 113 to each other.

Alternatively, delay lines 144 can be implemented using differential in/differential out logic, using differential inverters, which provides the same logical results as the single in/single out logic 140. An example of differential in/differential out logic 146, using differential inverters 148, is shown in FIG. 11. Although not shown in FIG. 11, tap points A, B, and B' would be included in the differential in/differential out logic 146 and placed to achieve similar results in matching edge rising and falling for timing pulses 113 as the delay lines 144 implemented as single in, single out logic 140 shown in FIG. 10.

Output of the tap points A and B' taken from delay lines 144 are then input to NAND gate 150 and output tap points C and D taken from delay lines 144 are then input to NOR gate 152 included in logic circuit 142, which then outputs timing signals 113.

Figure 12:
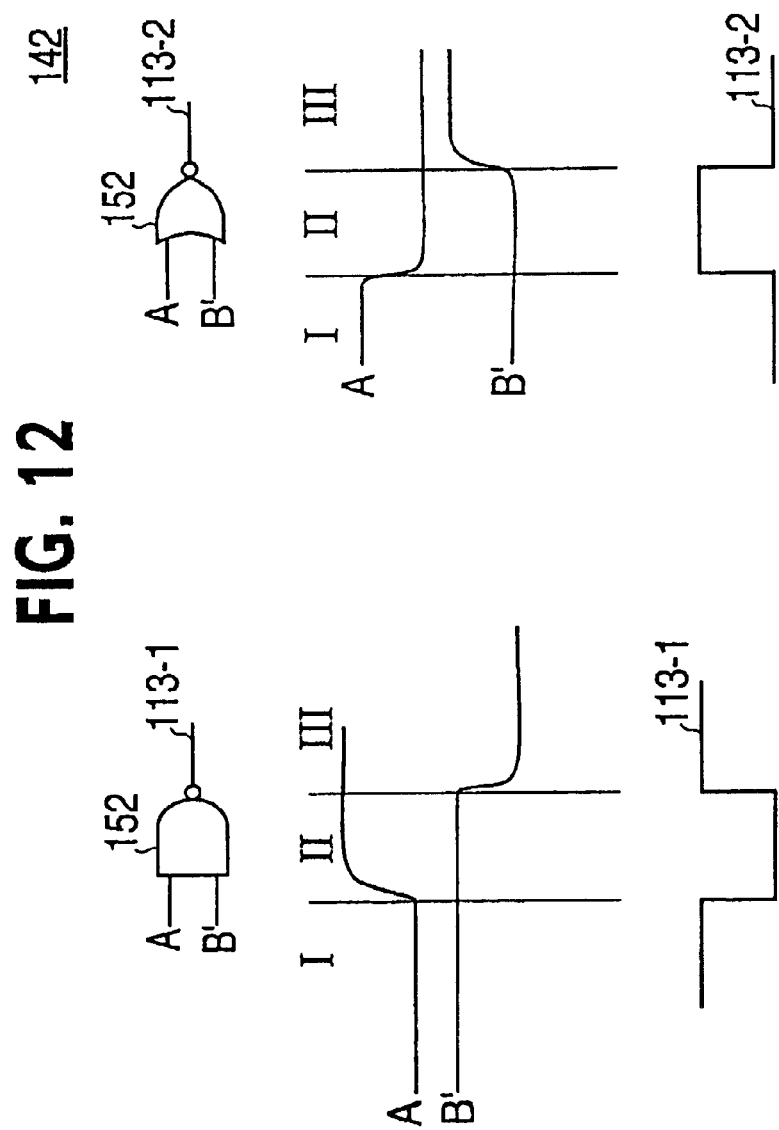
FIG. 12 shows timing signals 113-1 and 113-2 output, respectively, by NAND gate 150 and NOR gate 152, based upon input logic as shown in regions I, II, and III.

FIG. 12 shows timing signals 113-1 and 113-2 output, respectively, by NAND gate 150 and NOR gate 152, based upon input logic as shown in regions I, II, and III. More particularly, NAND gate 150 outputs timing signal 113-1 (a downward, square pulse) in region II when both input A and input B' are at voltage levels corresponding to logical "1". Likewise, NOR gate 152 outputs timing signal 113-2 (an upward, square pulse) in region II when both input A and input B' are at voltage levels corresponding to logical "0".

Referring to FIG. 12, applying the signals A and B' where B' is the equal to A_bar delayed by two inverters, as inputs to nand gate 150, a rising A edge is followed by a delayed falling edge B' to produce downward pulse 113-1 with a width defined by the two inverter delay separating the edges.

Alternatively, a falling edge followed by a rising edge delayed by a fixed time, applied to the inputs of the nor gate 152 produce at output 113-2 an upward square pulse with duration defined by the delay period. If as indicated in FIG. 12 Taps A and B' are used as inputs to nor gate 152, the upward pulse is generated on the falling edge of A. To align the upward pulse with the same time as the downward pulse produced by nand gate 150 with inputs A and B', complementary signals can be found along the two inverter delay strings having the proper alignment and transition. Tap C in FIG. 10 is aligned in time with the signal at A and is falling as A is rising. Similarly TAP D is the desired two delay inverted signal from D. Using C and D as inputs to the nor gate 152 produces upward pulses aligned in time with the downward pulses produced by the nand gate 150 beginning at the rising edge of Tap A.

By proper selection of signals A, B', C, and D, aligned upward and downward square pulses are produced as outputs of NOR 152 and NAND 150 gates. Other combinations of Taps will produce upward and downward pulses delayed by fixed amounts with respect to the pulses generated using A and B' and C and D taps into nand gate 150 and nor gate 152 respectively.

An upward pulse produced by NOR gate 152 can be delayed by two inverters to produce 120 in set 113 while producing the non-delayed upward pulse 124, and the downward pulse produced by the nand gate 150 can be delayed by two inverters to produce 126 in 113 and the non-delayed downward pulse 122. The set 113 now consists of downward pulse 122, downward pulse delayed 126, upward pulse 124 and upward pulse delayed 126. Further downward pulse 122 is aligned with upward pulse 124 and downward pulse 126 is aligned with upward pulse 120.

Control circuit 112 outputs as timing signals 113 the timing signals 120, 122, 124, and 126 shown in FIGS. 9A, 9B, 9C, and 9D, respectively, to multiplexer 114.

Based upon control circuit 112, the mono-cycle generating circuit 110 of the present invention exhibits bipolarity in that the mono-cycle generating circuit 110 outputs both positive mono-cycles 100 and negative mono-cycles 102.

Based upon DATA, multiplexer 114 switches and aligns between positive mono-cycles 100 and negative mono-cycles 102 to carry information as a sequence of logical "1"'s and "0"'s. That is, multiplexer 114 encodes the mono-cycles 100, 102 as a string of arbitrarily defined positive and negative sequences.

Figure 13:
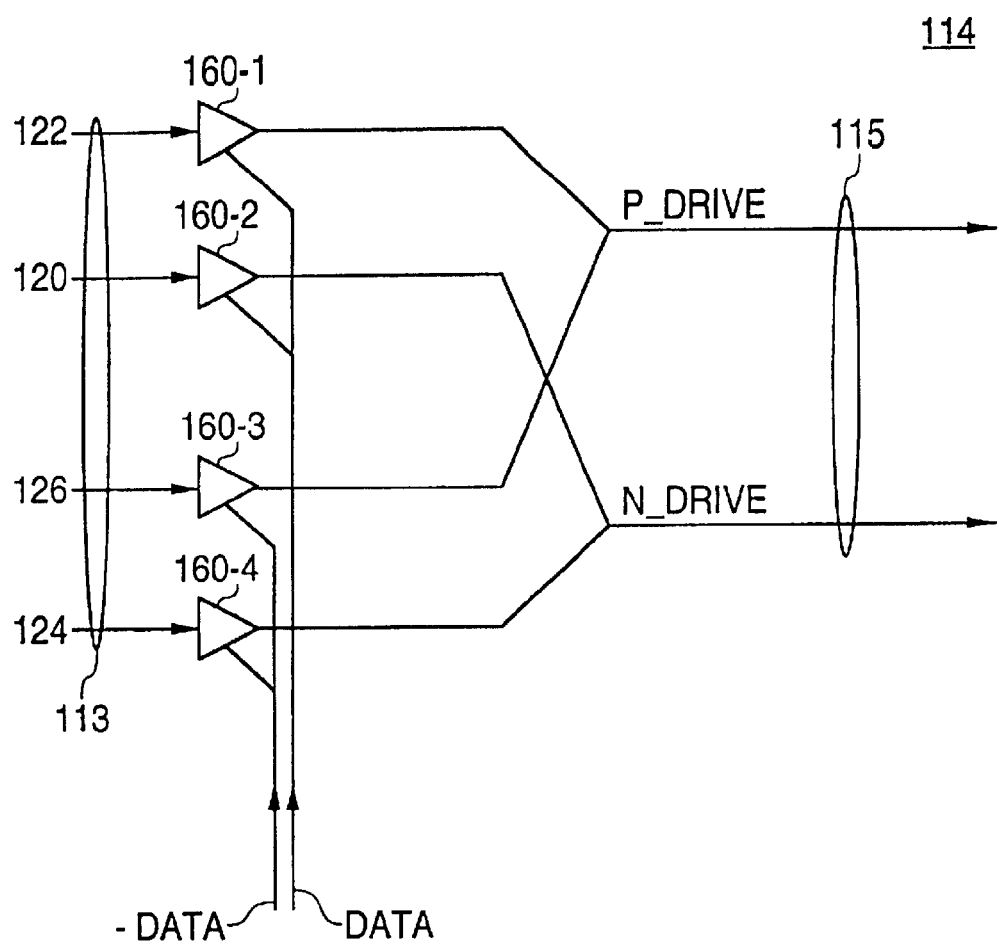
FIG. 13 shows a circuit diagram of multiplexer 114 of the present invention.

FIG. 13 shows a circuit diagram of multiplexer 114 of the present invention. As shown in FIG. 13, multiplexer 114 receives as input timing pulses 120, 122, 124, and 126, and DATA and −DATA, and outputs signals P_Drive and N_Drive as timing pulses 115. Timing pulses 122 and 126 each drive switches SW2 (an nMOS transistor) and SW4 (a pMOS transistor), while timing pulses 122 and 126 each drive switches SW1 (a pMOS transistor) and SW3 (an nMOS transistor). Thus, based on the logical value of DATA (and −DATA), multiplexer 114 selects either timing pulse 122 to be output as P_Drive and timing pulse 120 to be output as N_Drive (which would result in driver switch circuit 116 outputting a positive mono-cycle 100) or timing pulse 126 to be output as P_Drive and timing pulse 124 to be output as N_Drive (which would result in driver switch circuit 116 outputting a negative mono-cycle 102).

As shown in FIG. 13, multiplexer 114 comprises tri-state buffers 160-1, 160-2, 160-3, and 160-4. If DATA is a logical "1", then buffers 160-1 and 160-2 are turned on and timing signals 120 and 122 are selected to be output as N_Drive and P_Drive, respectively. If DATA is a logical "1", then −DATA is a logical "0" and buffers 160-3 and 160-4 are turned off and timing signals 124 and 126 are not selected. Likewise, if DATA is a logical "0", then buffers 160-1 and 160-2 are turned off and timing signals 120 and 122 are not selected. If DATA is a logical "0", then −DATA is a logical "1" and buffers 160-3 and 160-4 are turned on and timing signals 126 and 124 are selected to be output as P_Drive and N_Drive, respectively. Delays through each of the tri-state buffers 160 and along P_Drive and N_Drive are matched so that P_Drive and N_Drive are matched in time with each other, thus ensuring that both the positive mono-cycle and the negative mono-cycle have zero-crossings at the same point in each waveform.

More particularly, if DATA is logical "1", then the positive mono-cycle is generated and the negative mono-cycle is not generated. Alternatively, if DATA is logical "0", then the negative mono-cycle is generated and the positive mono-cycle is not generated.

Accordingly, the logical bit stream of "1"'s and "0"'s which is transmitted to the monocycle generating circuit 110 of the present invention through DATA determines the transmission sequence of positive mono-cycles and negative mono-cycles by the mono-cycle generating circuit 110.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A mono-cycle generating circuit comprising:
   a control circuit generating sets of timing pulses;
   a multiplexer coupled to the control circuit and selecting one of the sets of timing pulses; and
   a driver switch circuit coupled to the multiplexer and outputting a mono-cycle based upon the selected set of timing pulses, said driver switch circuit comprising complementary sets of switches, each complementary set of switches including complementary amplitude pull-up/pull-down functions such that the output mono-cycle is a full rail swing mono-cycle.

2. The mono-cycle generating circuit as in claim 1, wherein each complementary set of switches comprises 2 switches coupled in series with each other between VDD and ground.

3. The mono-cycle generating circuit as in claim 2, wherein one of the sets of switches comprises a voltage divider coupled in series between the 2 switches included in the one of the sets of switches.

4. The mono-cycle generating circuit as in claim 3, wherein the voltage divider comprises 2 resistors coupled in series with each other, and the output of the driver switch circuit is taken between the resistors of the voltage divider of the one of the sets of switches and between the 2 switches included in a second of the sets of switches, and wherein the output comprises the mono-cycle.

5. The mono-cycle generating circuit as in claim 4, wherein the mono-cycle is symmetric in shape.

6. The mono-cycle generating circuit as in claim 4, wherein the shape of the mono-cycle is determined by the state of each of the switches.

7. The mono-cycle generating circuit as in claim 4, wherein the peak-to-peak period of the mono-cycle is determined by gate propagation times.

8. The mono-cycle generating circuit as in claim 1, wherein a quiet value of the mono-cycle is mid-rail.

9. The mono-cycle generating circuit as in claim 1, wherein one of a positive mono-cycle and a negative mono-cycle is output based upon a logical value of an encoded bit received by the mono-cycle generating circuit.

10. The mono-cycle generating circuit as in claim 1, wherein each complementary set of switches comprises a p-MOS transistor and an n-MOS transistor.

11. A mono-cycle generating circuit comprising:
    a control circuit generating sets of timing pulses;
    a multiplexer coupled to the control circuit and selecting one of the sets of timing pulses; and
    a driver switch circuit coupled to the multiplexer and outputting a mono-cycle based upon the selected one of the sets of timing pulses, said driver switch circuit comprising:
    a first complementary set of switches comprising a first p-MOS transistor and a first n-MOS transistor, and
    a second complementary sets of switches comprising a second p-MOS transistor and a second n-MOS transistor,
    wherein each of the first and second complementary sets of switches includes complementary amplitude pull-up/pull-down functions such that the output mono-cycle is a full rail swing mono-cycle,
    wherein the source of each of the first and second n-MOS transistors is coupled to ground and the source of each of the first and second p-MOS transistors is coupled to VDD,
    wherein the drain of the first p-MOS transistor is coupled to the drain of the first n-MOS transistor,
    wherein the drain of the second p-MOS transistor is coupled to the drain of the second n-MOS transistor through a voltage divider,
    wherein the gate of the first n-MOS transistor and the gate of the second p-MOS transistor are coupled to a first subset of the timing pulses, and
    wherein the gate of the second n-MOS transistor and the gate of the first p-MOS transistor are coupled to a second subset of the timing pulses.

12. The mono-cycle generating circuit as in claim 11, wherein the multiplexer receives encoded data and comprises tn-state buffers respectively receiving the sets of timing signals output by the control circuit, and selecting and outputting one of the sets of timing signals based upon the logical value of the encoded data received by the multiplexer, said selected one of the sets of tuning signals comprising the first subset and the second subset.

13. The mono-cycle generating circuit as in claim 1, wherein the control circuit produces the timing pulses based upon delay lines formed in close proximity to each other.

14. An apparatus comprising:
    a control circuit receiving an input clock signal and an input inverse clock signal, and outputting based upon the input clock signal and the input inverse clock signal, a first set of timing signals and a second set of timing signals;
    a multiplexer coupled to the control circuit and receiving the first set of timing signals and the second set of timing signals, and receiving an input logical value, said multiplexer selecting and outputting as selected timing signals one of the first set of timing signals and the second set of tinting signals based upon the input logical value; and
    a driver switch circuit generating circuit coupled to the multiplexer and receiving the selected timing signals, said driver switch circuit generating circuit comprising a first p-MOS transistor coupled to a first n-MOS transistor, and a second p-MOS transistor coupled to a second n-MOS transistor through a voltage divider, wherein said selected timing signals comprise a first subset of timing signals and a second subset of timing signals, said first subset coupled to and controlling the respective gates of the first n-MOS transistor and the second p-MOS transistor, and said second subset coupled to and controlling the respective gates of the first p-MOS transistor and the second n-MOS transistor such that each of the p-MOS and the n-MOS transistors makes a state transition simultaneously to output a mono-cycle.

15. The apparatus as in claim 14, wherein the output mono-cycle is one of a positive mono-cycle and a negative mono-cycle based upon the input logical value.

16. The apparatus as in claim 15, wherein if the second subset asserts a downward, square pulse prior in time to the first subset asserting an upward, square pulse, then the output mono-cycle is a positive mono-cycle, whereas if the second subset asserts a downward, square pulse subsequent in time to the first subset asserting an upward, square pulse, then the output mono-cycle is a negative mono-cycle.

17. The apparatus as in claim 16, wherein the trailing edge of the downward, square pulse is aligned with the leading edge of the upward, square pulse if the downward, square pulse precedes the upward, square pulse in time, and the trailing edge of the downward, square pulse is aligned with the leading edge of the upward, square pulse, if the upward, square pulse precedes the downward, square pulse in time.

18. An apparatus comprising:
   means for receiving an input clock signal and an input inverse clock signal, and outputting based upon the input clock signal and the input inverse clock signal, a first set of timing signals and a second set of timing signals; and
   a driver switch circuit receiving the timing signals, said driver switch circuit comprising a first p-MOS transistor coupled to a first n-MOS transistor, and a second p-MOS transistor coupled to a second n-MOS transistor through a voltage divider,
   wherein said first set of timing signals is coupled to and controls the respective gates of the first n-MOS transistor and the second p-MOS transistor, and said second set of timing signals is coupled to and controls the respective gates of the second n-MOS transistor and the first p-MOS transistor such that each of the p-MOS and the n-MOS transistors makes a state transition simultaneously to output a mono-cycle.

19. The apparatus as in claim 18, wherein the mono-cycle comprises a full rail swing, symmetric mono-cycle.

20. The apparatus as in claim 19, wherein each output mono-cycle comprises encoded data.

* * * * *

UNITED STATES PATENT AND TRADEMARK OFFICE
CERTIFICATE OF CORRECTION

PATENT NO. : 6,812,762 B2
DATED : November 2, 2004
INVENTOR(S) : Augustin Ochoa, Phuong T. Huynh and John McCorkle It is certified that error appears in the above-identified patent and that said Letters Patent is hereby corrected as shown below:

Column 10,
Line 23, correct Claim 12 as:
12.    The mono-cycle generating circuit as in claim 11, wherein the multiplexer receives encoded data and comprises a tri-state buffers respectively receiving the sets of timing signals output by the control circuit, and selecting and outputting one of the sets of timing signals based upon the logical value of the encoded data received by the multiplexer, said selected one of the sets of timing signals comprising the first subset and the second subset.

Signed and Sealed this

Twenty-second Day of February, 2005

JON W. DUDAS
*Director of the United States Patent and Trademark Office*